United States Patent
Kang et al.

(10) Patent No.: US 10,672,919 B2
(45) Date of Patent: Jun. 2, 2020

(54) MOISTURE-RESISTANT SOLAR CELLS FOR SOLAR ROOF TILES

(71) Applicant: TESLA, INC., Palo Alto, CA (US)

(72) Inventors: Yangsen Kang, Santa Clara, CA (US); Zhigang Xie, San Jose, CA (US); Jianhua Hu, Palo Alto, CA (US)

(73) Assignee: TESLA, INC., Palo Alto, CA (US)

( * ) Notice: Subject to any disclaimer, the term of this patent is extended or adjusted under 35 U.S.C. 154(b) by 0 days.

(21) Appl. No.: 15/709,315

(22) Filed: Sep. 19, 2017

(65) Prior Publication Data

US 2019/0088802 A1   Mar. 21, 2019

(51) Int. Cl.
| | |
|---|---|
| *H01L 31/0216* | (2014.01) |
| *H02S 20/23* | (2014.01) |
| *H01L 31/0747* | (2012.01) |
| *H01L 31/20* | (2006.01) |
| *H01L 31/049* | (2014.01) |
| *H01L 31/048* | (2014.01) |

(52) U.S. Cl.
CPC ...... *H01L 31/02167* (2013.01); *H01L 31/049* (2014.12); *H01L 31/0481* (2013.01); *H01L 31/0488* (2013.01); *H01L 31/0747* (2013.01); *H01L 31/202* (2013.01); *H01L 31/208* (2013.01); *H02S 20/23* (2014.12)

(58) Field of Classification Search
CPC .......... H01L 31/02167; H01L 31/0488; H01L 31/208; H01L 31/0481; H01L 31/202; H01L 31/0747; H01L 31/049; H02S 20/23
See application file for complete search history.

(56) References Cited

U.S. PATENT DOCUMENTS

| | | |
|---|---|---|
| 819,360 A | 3/1902 | Mayer |
| 2,938,938 A | 5/1960 | Dickson |
| 3,094,439 A | 6/1963 | Mann et al. |
| 3,116,171 A | 12/1963 | Nielsen |
| 3,459,597 A | 8/1969 | Baron |
| 3,676,179 A | 7/1972 | Bokros |
| 3,961,997 A | 6/1976 | Chu |
| 3,969,163 A | 7/1976 | Wakefield |

(Continued)

FOREIGN PATENT DOCUMENTS

| | | |
|---|---|---|
| CN | 1253381 | 5/2000 |
| CN | 1416179 | 10/2001 |

(Continued)

OTHER PUBLICATIONS

Electrically Conductive Foil Tape for Bus Bar Components in Photovoltaic Modules, Adhesives Research, http://www.adhesivesresearch.com/electrically-conductive-foil-tape-for-bus-bar-components-in-photovoltaic-modules/, accessed Oct. 12, 2017.

(Continued)

*Primary Examiner* — Joshua K Ihezie
(74) *Attorney, Agent, or Firm* — Dentons US LLP

(57) ABSTRACT

One embodiment can provide a solar module. The solar module can include one or more moisture-resistant photovoltaic structures. A respective photovoltaic structure can include a base layer, an emitter layer positioned on a first side of the base layer, and a moisture barrier layer positioned on a first side of the emitter layer, thereby reducing the amount of moisture that reaches a junction between the base layer and the emitter layer.

7 Claims, 9 Drawing Sheets

(56) References Cited

U.S. PATENT DOCUMENTS

| | | |
|---|---|---|
| 4,015,280 A | 3/1977 | Matsushita et al. |
| 4,082,568 A | 4/1978 | Lindmayer |
| 4,124,410 A | 11/1978 | Kotval et al. |
| 4,124,455 A | 11/1978 | Lindmayer |
| 4,193,975 A | 3/1980 | Kotval et al. |
| 4,200,621 A | 4/1980 | Liaw et al. |
| 4,213,798 A | 7/1980 | Williams et al. |
| 4,228,315 A | 10/1980 | Napoli |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder et al. |
| 4,342,044 A | 7/1982 | Ovshinsky et al. |
| 4,377,723 A | 3/1983 | Dalal |
| 4,431,858 A | 2/1984 | Gonzalez et al. |
| 4,514,579 A | 4/1985 | Hanak |
| 4,540,843 A | 9/1985 | Gochermann et al. |
| 4,567,642 A | 2/1986 | Dilts et al. |
| 4,571,448 A | 2/1986 | Barnett |
| 4,577,051 A | 3/1986 | Hartman |
| 4,586,988 A | 5/1986 | Nath et al. |
| 4,589,191 A | 5/1986 | Green et al. |
| 4,612,409 A | 9/1986 | Hamakawa et al. |
| 4,617,421 A | 10/1986 | Nath |
| 4,633,033 A | 12/1986 | Nath et al. |
| 4,652,693 A | 3/1987 | Bar-On |
| 4,657,060 A | 4/1987 | Kaucic |
| 4,667,060 A | 5/1987 | Spitzer |
| 4,670,096 A | 6/1987 | Schwirtlich |
| 4,694,115 A | 9/1987 | Lillington et al. |
| 4,729,970 A | 3/1988 | Nath |
| 4,753,683 A | 6/1988 | Ellion |
| 4,771,017 A | 9/1988 | Tobin et al. |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,057,163 A | 10/1991 | Barnett |
| 5,075,763 A | 12/1991 | Spitzer et al. |
| 5,084,107 A | 1/1992 | Deguchi |
| 5,118,361 A | 6/1992 | Fraas |
| 5,131,933 A | 7/1992 | Flodl et al. |
| 5,155,051 A | 10/1992 | Noguchi |
| 5,178,685 A | 1/1993 | Borenstein |
| 5,181,968 A | 1/1993 | Nath et al. |
| 5,213,628 A | 5/1993 | Noguchi et al. |
| 5,217,539 A | 6/1993 | Fraas et al. |
| 5,279,682 A | 1/1994 | Wald et al. |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi et al. |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo et al. |
| 5,676,766 A | 10/1997 | Probst et al. |
| 5,681,402 A | 10/1997 | Ichinose et al. |
| 5,698,451 A | 12/1997 | Hanoka |
| 5,705,828 A | 1/1998 | Noguchi et al. |
| 5,726,065 A | 3/1998 | Szlufcik et al. |
| 5,808,315 A | 9/1998 | Murakami |
| 5,814,195 A | 9/1998 | Lehan et al. |
| 5,903,382 A | 5/1999 | Tench et al. |
| 5,935,345 A | 8/1999 | Kuznicki |
| 5,942,048 A | 8/1999 | Fujisaki |
| 6,017,581 A | 1/2000 | Hooker |
| 6,034,322 A | 3/2000 | Pollard |
| 6,091,019 A | 7/2000 | Sakata et al. |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan et al. |
| 6,408,786 B1 | 6/2002 | Kennedy |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,620,645 B2 | 3/2003 | Fraas |
| 6,552,414 B1 | 4/2003 | Horzel et al. |
| 6,586,270 B2 | 7/2003 | Tsuzuki et al. |
| 2,626,907 A1 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,761,771 B2 | 7/2004 | Satoh |
| 6,803,513 B2 | 10/2004 | Beernink |
| 6,841,051 B2 | 1/2005 | Crowley |
| 6,917,755 B2 | 7/2005 | Nguyen |
| 7,030,413 B2 | 4/2006 | Nakamura et al. |
| 7,128,975 B2 | 10/2006 | Inomata |
| 7,164,150 B2 | 1/2007 | Terakawa et al. |
| 7,328,534 B2 | 2/2008 | Dinwoodie |
| 7,388,146 B2 | 6/2008 | Fraas |
| 7,399,385 B2 | 7/2008 | German et al. |
| 7,534,632 B2 | 5/2009 | Hu et al. |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German et al. |
| 7,977,220 B2 | 7/2011 | Sanjurjo |
| 7,985,919 B1 * | 7/2011 | Roscheisen ......... H01L 31/0392 136/246 |
| 8,070,925 B2 | 12/2011 | Hoffman et al. |
| 8,115,093 B2 | 2/2012 | Gui |
| 8,119,901 B2 | 2/2012 | Jang |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause et al. |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo et al. |
| 8,569,096 B1 | 10/2013 | Babayan |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,287,431 B2 | 3/2016 | Mascarenhas |
| 9,761,744 B2 | 9/2017 | Wang |
| 2001/0008143 A1 | 7/2001 | Sasaoka et al. |
| 2001/0023702 A1 | 9/2001 | Nakagawa |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes et al. |
| 2003/0070705 A1 | 4/2003 | Hayden et al. |
| 2003/0097447 A1 | 5/2003 | Johnston |
| 2003/0116185 A1 | 6/2003 | Oswald |
| 2003/0118865 A1 | 6/2003 | Marks |
| 2003/0121228 A1 | 7/2003 | Stoehr et al. |
| 2003/0136440 A1 | 7/2003 | Machida |
| 2003/0168578 A1 | 9/2003 | Taguchi et al. |
| 2003/0183270 A1 | 10/2003 | Falk et al. |
| 2003/0201007 A1 | 10/2003 | Fraas |
| 2004/0035458 A1 | 2/2004 | Beernink |

(56) References Cited

U.S. PATENT DOCUMENTS

| | | |
|---|---|---|
| 2004/0065363 A1 | 4/2004 | Fetzer et al. |
| 2004/0094196 A1* | 5/2004 | Shaheen ................ B82Y 10/00 |
| | | 136/263 |
| 2004/0112419 A1 | 6/2004 | Boulanger |
| 2004/0103937 A1 | 7/2004 | Bilyalov et al. |
| 2004/0112426 A1 | 7/2004 | Hagino |
| 2004/0123897 A1 | 7/2004 | Ojima et al. |
| 2004/0126213 A1 | 7/2004 | Pelzmann |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira et al. |
| 2005/0022861 A1 | 1/2005 | Crowley |
| 2005/0022746 A1 | 2/2005 | Lampe |
| 2005/0061665 A1 | 3/2005 | Pavani |
| 2005/0062041 A1 | 3/2005 | Terakawa |
| 2005/0064247 A1 | 3/2005 | Sane |
| 2005/0074954 A1 | 4/2005 | Yamanaka |
| 2005/0109388 A1 | 5/2005 | Murakami et al. |
| 2005/0126622 A1 | 6/2005 | Mukai |
| 2005/0133084 A1 | 6/2005 | Joge et al. |
| 2005/0172996 A1* | 8/2005 | Hacke ............. H01L 31/022458 |
| | | 136/256 |
| 2005/0178662 A1 | 8/2005 | Wurczinger |
| 2005/0189015 A1 | 9/2005 | Rohatgi et al. |
| 2005/0199279 A1 | 9/2005 | Yoshimine et al. |
| 2005/0252544 A1 | 11/2005 | Rohatgi et al. |
| 2005/0257823 A1 | 11/2005 | Zwanenburg |
| 2005/0263178 A1 | 12/2005 | Montello |
| 2005/0268963 A1 | 12/2005 | Jordan |
| 2006/0012000 A1 | 1/2006 | Estes et al. |
| 2006/0060238 A1 | 3/2006 | Hacke et al. |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach et al. |
| 2006/0231803 A1 | 10/2006 | Wang et al. |
| 2006/0255340 A1 | 11/2006 | Manivannan et al. |
| 2006/0260673 A1 | 11/2006 | Takeyama |
| 2006/0272698 A1 | 12/2006 | Durvasula |
| 2006/0283496 A1 | 12/2006 | Okamoto et al. |
| 2006/0283499 A1 | 12/2006 | Terakawa et al. |
| 2007/0023081 A1 | 2/2007 | Johnson et al. |
| 2007/0023082 A1 | 2/2007 | Manivannan et al. |
| 2007/0029186 A1* | 2/2007 | Krasnov ............. C03C 17/3423 |
| | | 204/192.29 |
| 2007/0108437 A1 | 5/2007 | Tavkhelidze |
| 2007/0110975 A1 | 5/2007 | Schneweis |
| 2007/0132034 A1 | 6/2007 | Curello et al. |
| 2007/0137699 A1 | 6/2007 | Manivannan et al. |
| 2007/0148336 A1 | 6/2007 | Bachrach et al. |
| 2007/0186853 A1 | 8/2007 | Gurary |
| 2007/0186968 A1 | 8/2007 | Nakauchi |
| 2007/0186970 A1 | 8/2007 | Takahashi et al. |
| 2007/0187652 A1 | 8/2007 | Konno |
| 2007/0202029 A1 | 8/2007 | Burns et al. |
| 2007/0235077 A1 | 10/2007 | Nagata |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann et al. |
| 2007/0283997 A1 | 12/2007 | Hachtmann |
| 2008/0000522 A1 | 1/2008 | Johnson |
| 2008/0006323 A1* | 1/2008 | Kalkanoglu .......... H01L 31/048 |
| | | 136/253 |
| 2008/0011350 A1 | 1/2008 | Luch |
| 2008/0035489 A1 | 2/2008 | Allardyce |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar et al. |
| 2008/0053519 A1 | 3/2008 | Pearce |
| 2008/0061293 A1 | 3/2008 | Ribeyron |
| 2008/0092942 A1 | 4/2008 | Kinsey |
| 2008/0092947 A1 | 4/2008 | Lopatin et al. |
| 2008/0121272 A1 | 5/2008 | Besser et al. |
| 2008/0121276 A1 | 5/2008 | Lopatin et al. |
| 2008/0121932 A1 | 5/2008 | Ranade |
| 2008/0128013 A1 | 6/2008 | Lopatin |
| 2008/0128017 A1 | 6/2008 | Ford |
| 2008/0149161 A1 | 6/2008 | Nishida et al. |
| 2008/0149163 A1 | 6/2008 | Gangemi |
| 2008/0156370 A1 | 7/2008 | Abdallah et al. |
| 2008/0173347 A1 | 7/2008 | Korevaar |
| 2008/0173350 A1 | 7/2008 | Choi et al. |
| 2008/0178928 A1 | 7/2008 | Warfield |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness et al. |
| 2008/0223439 A1 | 9/2008 | Deng |
| 2008/0230122 A1 | 9/2008 | Terakawa |
| 2008/0251114 A1 | 10/2008 | Tanaka |
| 2008/0251117 A1 | 10/2008 | Schubert et al. |
| 2008/0264477 A1 | 10/2008 | Moslehi |
| 2008/0276983 A1 | 11/2008 | Drake et al. |
| 2008/0283115 A1 | 11/2008 | Fukawa et al. |
| 2008/0302030 A1 | 12/2008 | Stancel et al. |
| 2008/0303503 A1 | 12/2008 | Wolfs |
| 2008/0308145 A1 | 12/2008 | Krasnov et al. |
| 2009/0007965 A1 | 1/2009 | Rohatgi et al. |
| 2009/0014055 A1 | 1/2009 | Beck |
| 2009/0056805 A1 | 3/2009 | Barnett |
| 2009/0065043 A1 | 3/2009 | Hadorn |
| 2009/0078318 A1 | 3/2009 | Meyers et al. |
| 2009/0084439 A1 | 4/2009 | Lu et al. |
| 2009/0101872 A1 | 4/2009 | Young et al. |
| 2009/0120492 A1 | 5/2009 | Sinha |
| 2009/0139512 A1 | 6/2009 | Lima |
| 2009/0151771 A1 | 6/2009 | Kothari |
| 2009/0151783 A1 | 6/2009 | Lu et al. |
| 2009/0155028 A1 | 6/2009 | Boguslayskiy |
| 2009/0160259 A1 | 6/2009 | Naiknaware |
| 2009/0188561 A1 | 7/2009 | Aiken et al. |
| 2009/0194233 A1 | 8/2009 | Tamura |
| 2009/0211627 A1* | 8/2009 | Meier .................. H01L 31/068 |
| | | 136/255 |
| 2009/0221111 A1 | 9/2009 | Frolov et al. |
| 2009/0229660 A1 | 9/2009 | Takizawa |
| 2009/0229854 A1 | 9/2009 | Fredenberg |
| 2009/0239331 A1 | 9/2009 | Xu et al. |
| 2009/0250108 A1 | 10/2009 | Zhou et al. |
| 2009/0255574 A1 | 10/2009 | Yu et al. |
| 2009/0260689 A1 | 10/2009 | Nishi |
| 2009/0272419 A1 | 11/2009 | Sakamoto |
| 2009/0277491 A1 | 11/2009 | Nakamura |
| 2009/0283138 A1 | 11/2009 | Lin et al. |
| 2009/0283145 A1 | 11/2009 | Kim et al. |
| 2009/0293948 A1 | 12/2009 | Tucci et al. |
| 2009/0301549 A1 | 12/2009 | Moslehi |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman et al. |
| 2010/0043863 A1 | 2/2010 | Wudu |
| 2010/0065111 A1 | 3/2010 | Fu et al. |
| 2010/0068890 A1 | 3/2010 | Stockum et al. |
| 2010/0084009 A1 | 4/2010 | Carlson |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu et al. |
| 2010/0131108 A1 | 5/2010 | Meyer |
| 2010/0132774 A1 | 6/2010 | Borden |
| 2010/0132792 A1 | 6/2010 | Kim et al. |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |

(56) References Cited

U.S. PATENT DOCUMENTS

| | | |
|---|---|---|
| 2010/0218799 A1 | 9/2010 | Stefani |
| 2010/0224230 A1 | 9/2010 | Luch et al. |
| 2010/0229914 A1 | 9/2010 | Adriani |
| 2010/0236612 A1 | 9/2010 | Khajehoddin |
| 2010/0240172 A1 | 9/2010 | Rana |
| 2010/0243021 A1 | 9/2010 | Lee |
| 2010/0243059 A1 | 9/2010 | Okaniwa |
| 2010/0269904 A1 | 10/2010 | Cousins |
| 2010/0279492 A1 | 11/2010 | Yang |
| 2010/0282293 A1 | 11/2010 | Meyer |
| 2010/0295091 A1 | 11/2010 | Strzegowski |
| 2010/0300506 A1 | 12/2010 | Heng et al. |
| 2010/0300507 A1 | 12/2010 | Heng et al. |
| 2010/0300525 A1 | 12/2010 | Lim |
| 2010/0307592 A1 | 12/2010 | Chang |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0023958 A1 | 2/2011 | Masson |
| 2011/0030777 A1 | 2/2011 | Lim |
| 2011/0036390 A1 | 2/2011 | Nelson |
| 2011/0048491 A1 | 3/2011 | Taira |
| 2011/0056545 A1 | 3/2011 | Ji |
| 2011/0073175 A1 | 3/2011 | Hilali |
| 2011/0088762 A1 | 4/2011 | Singh |
| 2011/0089079 A1 | 4/2011 | Lo |
| 2011/0120518 A1 | 5/2011 | Rust |
| 2011/0132426 A1 | 6/2011 | Kang |
| 2011/0146759 A1 | 6/2011 | Lee |
| 2011/0146781 A1 | 6/2011 | Laudisio et al. |
| 2011/0156188 A1 | 6/2011 | Tu |
| 2011/0168250 A1 | 7/2011 | Lin et al. |
| 2011/0168261 A1 | 7/2011 | Welser |
| 2011/0174374 A1 | 7/2011 | Harder |
| 2011/0177648 A1* | 7/2011 | Tanner ............... H01L 21/67236 438/72 |
| 2011/0186112 A1 | 8/2011 | Aernouts |
| 2011/0197947 A1 | 8/2011 | Croft |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng et al. |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch et al. |
| 2011/0300661 A1 | 12/2011 | Pearce |
| 2011/0308573 A1 | 12/2011 | Jaus |
| 2012/0000502 A1 | 1/2012 | Wiedeman |
| 2012/0012153 A1 | 1/2012 | Azechi |
| 2012/0012174 A1 | 1/2012 | Wu |
| 2012/0028461 A1 | 2/2012 | Ritchie et al. |
| 2012/0031480 A1 | 2/2012 | Tisler |
| 2012/0040487 A1 | 2/2012 | Asthana |
| 2012/0042925 A1 | 2/2012 | Pfennig |
| 2012/0060911 A1 | 3/2012 | Fu |
| 2012/0073975 A1 | 3/2012 | Ganti |
| 2012/0080083 A1 | 4/2012 | Liang |
| 2012/0085384 A1 | 4/2012 | Beitel et al. |
| 2012/0103408 A1* | 5/2012 | Moslehi ............ H01L 31/022441 136/256 |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0152752 A1 | 6/2012 | Keigler |
| 2012/0167986 A1 | 7/2012 | Meakin |
| 2012/0180851 A1* | 7/2012 | Nagel ............... H01L 31/02021 136/251 |
| 2012/0192932 A1 | 8/2012 | Wu et al. |
| 2012/0199184 A1 | 8/2012 | Nie |
| 2012/0240995 A1 | 9/2012 | Coakley |
| 2012/0248497 A1 | 10/2012 | Zhou |
| 2012/0279443 A1 | 11/2012 | Kommeyer |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng et al. |
| 2012/0319253 A1 | 12/2012 | Mizuno |
| 2012/0325282 A1 | 12/2012 | Snow |
| 2013/0000705 A1 | 1/2013 | Shappir |
| 2013/0000715 A1* | 1/2013 | Moslehi ........... H01L 31/022441 136/256 |
| 2013/0014802 A1 | 1/2013 | Zimmerman |
| 2013/0019919 A1 | 1/2013 | Hoang |
| 2013/0056051 A1 | 3/2013 | Jin |
| 2013/0096710 A1 | 4/2013 | Pinarbasi |
| 2013/0098429 A1* | 4/2013 | Funayama ........... H01L 31/0481 136/251 |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | DeGroot |
| 2013/0160826 A1 | 6/2013 | Beckerman |
| 2013/0174897 A1 | 7/2013 | You |
| 2013/0199608 A1* | 8/2013 | Emeraud ............. H01L 31/1864 136/256 |
| 2013/0206213 A1 | 8/2013 | He |
| 2013/0206219 A1* | 8/2013 | Kurtin ............... H01L 31/02168 136/255 |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0239891 A1 | 9/2013 | Sonoda |
| 2013/0247955 A1 | 9/2013 | Baba |
| 2013/0269771 A1 | 10/2013 | Cheun |
| 2013/0291743 A1 | 11/2013 | Endo |
| 2013/0306128 A1 | 11/2013 | Kannou |
| 2014/0000682 A1 | 1/2014 | Zhao |
| 2014/0053899 A1 | 2/2014 | Haag |
| 2014/0060621 A1 | 3/2014 | Clark |
| 2014/0066265 A1 | 3/2014 | Oliver |
| 2014/0096823 A1* | 4/2014 | Fu ................... H01L 31/022433 136/256 |
| 2014/0102502 A1 | 4/2014 | Luch |
| 2014/0102524 A1 | 4/2014 | Xie |
| 2014/0120699 A1 | 5/2014 | Hua |
| 2014/0124013 A1 | 5/2014 | Morad et al. |
| 2014/0124014 A1 | 5/2014 | Morad |
| 2014/0154836 A1 | 6/2014 | Kim |
| 2014/0196768 A1 | 7/2014 | Heng et al. |
| 2014/0242746 A1 | 8/2014 | Albadri |
| 2014/0261624 A1 | 9/2014 | Cruz-Campa |
| 2014/0261654 A1 | 9/2014 | Babayan |
| 2014/0261661 A1 | 9/2014 | Babayan |
| 2014/0262793 A1 | 9/2014 | Babayan |
| 2014/0273338 A1* | 9/2014 | Kumar ............. H01L 31/022425 438/98 |
| 2014/0284750 A1* | 9/2014 | Yu .................... H01L 31/022425 257/436 |
| 2014/0299187 A1 | 10/2014 | Chang |
| 2014/0318611 A1 | 10/2014 | Moslehi |
| 2014/0345674 A1* | 11/2014 | Yang ................ H01L 31/02013 136/251 |
| 2014/0349441 A1 | 11/2014 | Fu |
| 2014/0352777 A1 | 12/2014 | Hachtmann |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0129024 A1 | 5/2015 | Brainard |
| 2015/0144180 A1 | 5/2015 | Baccini |
| 2015/0171230 A1 | 6/2015 | Kapur |
| 2015/0206997 A1* | 7/2015 | Fidaner ........... H01L 31/022441 136/255 |

(56) References Cited

U.S. PATENT DOCUMENTS

| | | | |
|---|---|---|---|
| 2015/0207011 A1* | 7/2015 | Garnett | H01L 31/0368 136/255 |
| 2015/0214409 A1 | 7/2015 | Pfeiffer | |
| 2015/0236177 A1 | 8/2015 | Fu | |
| 2015/0270410 A1 | 9/2015 | Heng | |
| 2015/0280641 A1 | 10/2015 | Garg | |
| 2015/0303338 A1* | 10/2015 | Kwon | B32B 27/34 136/256 |
| 2015/0325731 A1 | 11/2015 | Namjoshi | |
| 2015/0333199 A1 | 11/2015 | Kim | |
| 2015/0340531 A1 | 11/2015 | Hayashi | |
| 2015/0349145 A1 | 12/2015 | Morad | |
| 2015/0349153 A1 | 12/2015 | Morad | |
| 2015/0349161 A1 | 12/2015 | Morad | |
| 2015/0349162 A1 | 12/2015 | Morad | |
| 2015/0349167 A1 | 12/2015 | Morad | |
| 2015/0349168 A1 | 12/2015 | Morad | |
| 2015/0349169 A1 | 12/2015 | Morad | |
| 2015/0349170 A1 | 12/2015 | Morad | |
| 2015/0349171 A1 | 12/2015 | Morad | |
| 2015/0349172 A1 | 12/2015 | Morad | |
| 2015/0349173 A1 | 12/2015 | Morad | |
| 2015/0349174 A1 | 12/2015 | Morad | |
| 2015/0349175 A1 | 12/2015 | Morad | |
| 2015/0349176 A1 | 12/2015 | Morad | |
| 2015/0349190 A1 | 12/2015 | Morad | |
| 2015/0349193 A1 | 12/2015 | Morad | |
| 2015/0349701 A1 | 12/2015 | Morad | |
| 2015/0349702 A1 | 12/2015 | Morad | |
| 2015/0349703 A1 | 12/2015 | Morad | |
| 2016/0163888 A1 | 6/2016 | Reddy | |
| 2016/0190354 A1 | 6/2016 | Agrawal | |
| 2016/0204289 A1 | 7/2016 | Tao | |
| 2016/0233353 A1 | 8/2016 | Tamura | |
| 2016/0268963 A1 | 9/2016 | Tsai | |
| 2016/0322513 A1 | 11/2016 | Martin | |
| 2016/0329443 A1 | 11/2016 | Wang | |
| 2017/0084766 A1 | 3/2017 | Yang | |
| 2017/0162722 A1* | 6/2017 | Fu | H01L 31/0201 |
| 2017/0222082 A1 | 8/2017 | Lin | |
| 2017/0288081 A1 | 10/2017 | Babayan | |
| 2017/0373204 A1 | 12/2017 | Corneille | |
| 2018/0122964 A1* | 5/2018 | Adachi | H01L 31/02363 |

FOREIGN PATENT DOCUMENTS

| | | |
|---|---|---|
| CN | 101233620 | 7/2008 |
| CN | 101553933 | 10/2009 |
| CN | 102012010151 | 1/2010 |
| CN | 101305454 | 5/2010 |
| CN | 102088040 | 6/2011 |
| CN | 102263157 | 11/2011 |
| CN | 104205347 | 12/2014 |
| CN | 2626907 A1 | 3/2015 |
| DE | 4030713 | 4/1992 |
| DE | 102006009194 | 8/2007 |
| DE | 202007002897 | 8/2008 |
| DE | 102008045522 | 3/2010 |
| DE | 102010061317 | 6/2012 |
| DE | 10201201051 | 11/2013 |
| DE | H04245683 A | 11/2013 |
| EP | 1770791 | 4/2007 |
| EP | 1816684 | 8/2007 |
| EP | 2071635 | 6/2009 |
| EP | 2113946 | 11/2009 |
| EP | 2362430 | 8/2011 |
| EP | 2385561 | 11/2011 |
| EP | 2387079 | 11/2011 |
| EP | 2002057357 A | 11/2011 |
| EP | 2479796 A1 | 8/2013 |
| EP | 2479796 | 7/2015 |
| EP | 2626907 | 8/2015 |
| JP | 5789269 | 6/1982 |
| JP | S57089269 | 6/1982 |
| JP | 2011008881 A2 | 9/1992 |
| JP | 06196766 | 7/1994 |
| JP | 2385561 A2 | 9/1995 |
| JP | 10004204 | 1/1998 |
| JP | H1131834 | 2/1999 |
| JP | 2000164902 | 6/2000 |
| JP | 2010085949 | 2/2002 |
| JP | 20050122721 A | 6/2005 |
| JP | 2006523025 | 10/2006 |
| JP | 2006324504 | 11/2006 |
| JP | 2007123792 | 5/2007 |
| JP | 2008135655 | 6/2008 |
| JP | 2009054748 | 3/2009 |
| JP | 2009177225 | 8/2009 |
| JP | 2011181966 | 9/2011 |
| JP | 2012119393 | 6/2012 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 2003083953 A1 | 12/2005 |
| KR | 2005159312 A | 1/2006 |
| KR | 2006097189 A1 | 2/2009 |
| WO | 9120097 A1 | 11/1991 |
| WO | 2011005447 A2 | 12/1991 |
| WO | 1991017839 | 10/2003 |
| WO | 20060003277 A | 9/2006 |
| WO | 2008089657 | 7/2008 |
| WO | 2009094578 | 7/2009 |
| WO | 2009150654 | 12/2009 |
| WO | 20090011519 A | 12/2009 |
| WO | 2010070015 | 6/2010 |
| WO | 2009150654 A2 | 7/2010 |
| WO | 2010075606 | 7/2010 |
| WO | H07249788 A | 8/2010 |
| WO | 2010075606 A1 | 9/2010 |
| WO | 100580957 C | 10/2010 |
| WO | 2010123974 | 10/2010 |
| WO | 2010104726 A2 | 1/2011 |
| WO | 2010123974 A1 | 1/2011 |
| WO | 2011005447 | 1/2011 |
| WO | 2011008881 | 1/2011 |
| WO | 2011053006 | 5/2011 |
| WO | 104409402 | 10/2011 |
| WO | 2011123646 A2 | 7/2012 |
| WO | 2013020590 | 2/2013 |
| WO | 2013020590 A1 | 2/2013 |
| WO | 2013046351 | 4/2013 |
| WO | 2014066265 | 5/2014 |
| WO | 2014074826 | 5/2014 |
| WO | 2014110520 | 7/2014 |
| WO | 2014117138 | 7/2014 |
| WO | 2015183827 | 12/2015 |
| WO | 2015195283 | 12/2015 |
| WO | 2016090332 | 6/2016 |

OTHER PUBLICATIONS

Geissbuhler et al., Silicon Heterojunction solar Cells with Copper-Plated Grid Electrodes: Status and Comparison with Silver Thick-Film Techniques, IEEE Journal of Photovoltaics, vol. 4, No. 4, Jul. 2014.

Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.

O'Mara, W.C.; Herring, R.B.; Hunt L.P. (1990). Handbook of Semiconductor Silicon Technology. William Andrew Publishing/Noyes. pp. 275-293.

Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.

Beaucarne G et al: 'Epitaxial thin-film Si solar cells' Thin Solid Films, Elsevier-Sequoia S.A. Lausanne, CH LNKD—DOI:10.1016/

(56) References Cited

OTHER PUBLICATIONS

J.TSF.2005.12.003, vol. 511-512, Jul. 26, 2006 (Jul. 26, 2006), pp. 533-542, XP025007243 ISSN: 0040-6090 [retrieved on Jul. 26, 2006].
Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.
Davies, P.C.W., 'Quantum tunneling time,' Am. J. Phys. 73, Jan. 2005, pp. 23-27.
National Weather Service Weather Forecast Office ("Why Do We have Seasons?" http://www.crh.noaa.gov/lmk/?n=seasons Accessed Oct. 18, 2014).
Stangl et al., Amorphous/Crystalline Silicon heterojunction solar cells—a simulation study; 17th European Photovoltaic Conference, Munich, Oct. 2001.
WP Leroy et al., "In Search for the Limits of Rotating Cylindrical Magnetron Sputtering", Magnetron, ION Processing and ARC Technologies European Conference, Jun. 18, 2010, pp. 1-32.
Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20I.pptx> and converted to PDF.
Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.
Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.
Merriam-Webster online dictionary—"mesh". (accessed Oct. 8, 2012).
Green, Martin A. et al., 'High-Efficiency Silicon Solar Cells,' IEEE Transactions on Electron Devices, vol. ED-31, No. 5, May 1984, pp. 679-683.
Mueller, Thomas, et al. "High quality passivation for heteroj unction solar cells by hydrogenated amorphous silicon suboxide films." Applied Physics Letters 92.3 (2008): 033504-033504.
Collins English Dictionary (Convex. (2000). In Collins English Dictionary. http://search.credoreference.com/content/entry/hcengdict/convex/0 on Oct. 18, 2014).
Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.
Chabal, Yves J. et al., 'Silicon Surface and Interface Issues for Nanoelectronics,' The Electrochemical Society Interface, Spring 2005, pp. 31-33.
JCS Pires, J Otubo, AFB Braga, PR Mei; The purification of metallurgical grade silicon by electron beam melting, J of Mats Process Tech 169 (2005) 16-20.
Parthavi, "Doping by Diffusion and Implantation", <http://www.leb.eei.uni-erlangen.de/winterakademie/2010/report/course03/pdf/0306.pdf>.
Weiss, "Development of different copper seed layers with respect to the copper electroplating process," Microelectronic Engineering 50 (2000) 443-440, Mar 15, 2000.
Tomasi, "Back-contacted Silicon Heterojunction Solar Cells With Efficiency>21%" 2014 IEEE.
Munzer, K.A. "High Throughput Industrial In-Line Boron BSF Diffusion" Jun. 2005. 20th European Photovoltaic Solar Energy Conference, pp. 777-780.
Hornbachner et al., "Cambered Photovoltaic Module and Method for its Manufacture" Jun. 17, 2009.
Machine translation of JP 10004204 A, Shindou et al.
Jianhua Zhao et al. "24% Efficient perl silicon solar cell: Recent improvements in high efficiency silicon cell research"; Jun. 1996.
"Nonequilibrium boron doping effects in low-temperature epitaxial silicon" Meyerson et al., Appl. Phys. Lett. 50 (2), p. 113 (1987).
"Doping Diffusion and Implantation" Parthavi, <http://www.leb.eei.uni-erlangen.de/winterakademie/2010/report/content/course03/pdf/0306.pdf>; accessed Jul. 27, 2017.
Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.
Kanani, Nasser. Electroplating: Basic Principles, Processes and Practice, Chapter 8—"Coating Thickness and its Measurement," 2004, pp. 247-291.
P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.
L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.
Meyerson et al. "Nonequilibrium boron doping effects in low-temperature epitaxial silicon", Appl. Phys. Lett. 50 (2), p. 113 (1987).
Li, "Surface and Bulk Passsivation of Multicrystalline Silicon Solar Cells by Silicon Nitride (H) Layer: Modeling and Experiments", Ph.D. dissertation,N.J. Inst. of Tech., Jan. 2009.
Cui, et al., Advanced Materials, 2001, col. 13, pp. 1476-1480 (Year:2001).

\* cited by examiner

US 10,672,919 B2

MOISTURE-RESISTANT SOLAR CELLS FOR SOLAR ROOF TILES

FIELD OF THE INVENTION

This is generally related to solar modules. More specifically, this is related to solar roof tile modules.

Definitions

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A photovoltaic structure may be divided into a number of strips. A strip may have any shape and any size. The width and length of a strip may be the same as or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a "string."

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

A "solar roof tile" refers to a solar module that not only is capable of generating electricity by absorbing sunlight but can also function as a conventional roof tile.

BACKGROUND

Advances in photovoltaic technology, which is used to make solar panels, have helped solar energy gain mass appeal among those wishing to reduce their carbon footprint and decrease their monthly energy costs. In the past decade, the number of residential homes equipped with solar panels has grown significantly. However, conventional rooftop solar panels often leave some portion of the roof uncovered, thus missing the opportunity to collect as much solar energy as possible. In addition, these conventional rooftop panels can be industrial-looking and often lack the curb appeal many homeowners desire.

Solar shingles or tiles, on the other hand, are solar modules that have a similar appearance to conventional roof shingles or tiles. In addition to converting sunlight into electricity, the solar shingles or tiles also protect the roof from weather the same way traditional shingles or tiles do. They allow homeowners to turn their roof into an electricity generator while maintaining a conventional roofline.

Compared to traditional solar panels that were placed inside an aluminum frame, solar roof tiles are often frameless. This means that moisture may permeate the encapsulant from the edges of the tiles under wet conditions. On the other hand, many high-efficiency Si heterojunction (SHJ) solar cells use transparent conductive oxide (TCO) (e.g., indium tin oxide (ITO) or zinc oxide (ZnO)) for electrical contact. Compared to diffusion-based solar cells, TCO-based SHJ solar cells are more susceptible to moisture ingress. More specifically, conventional TCO materials tend to lose their material properties when exposed to moisture and may even serve as a medium through which moisture can reach the junction of the solar cell, thus degrading the solar cell performance drastically. Photovoltaic structures encapsulated within the solar roof tiles need to be moisture resistant.

SUMMARY

One embodiment can provide a solar module. The solar module can include one or more moisture-resistant photovoltaic structures. A respective photovoltaic structure can include a base layer, an emitter layer positioned on a first side of the base layer, and a moisture barrier layer positioned on a first side of the emitter layer, thereby reducing the amount of moisture that reaches a junction between the base layer and the emitter layer.

In a variation of the embodiment, the moisture barrier layer can include a moisture-resistant transparent conductive oxide (TCO) layer deposited on a surface of the emitter layer.

In a further variation, the moisture-resistant TCO layer can include an indium tin oxide (ITO) layer with a grain size of at least 40 nm.

In a further variation, the moisture-resistant TCO layer can include one or more of: Ti doped indium oxide, Ti and Ta doped indium oxide, tungsten doped indium oxide cerium doped indium oxide, Si doped ZnO, and Ga and In co-doped ZnO (IGZO).

In a variation of the embodiment, the moisture barrier layer can include a dielectric coating.

In a further variation, the solar module can further include a transparent conductive oxide (TCO) layer positioned between the dielectric coating and the emitter layer.

In a further variation, the dielectric coating can include silicon oxide ($SiO_x$) or silicon nitride ($SiN_x$).

In a further variation, the dielectric coating can be formed using a plasma-enhanced chemical vapor deposition (PECVD) technique.

In a variation of the embodiment, the solar module can include a surface field layer positioned on a second side of the base layer and a second moisture barrier layer positioned on a first side of the surface field layer.

One embodiment can provide a solar roof tile. The solar roof tile can include a front cover, a back cover, and one or more photovoltaic structures positioned between the front cover and the back cover. A respective photovoltaic structure can include a base layer, an emitter layer positioned on a first side of the base layer, and a moisture barrier layer positioned on a first side of the emitter layer, thereby reducing the amount of moisture that reaches a junction between the base layer and the emitter layer.

BRIEF DESCRIPTION OF THE FIGURES

In the figures, like reference numerals refer to the same figure elements.

DETAILED DESCRIPTION

Figure 1A:
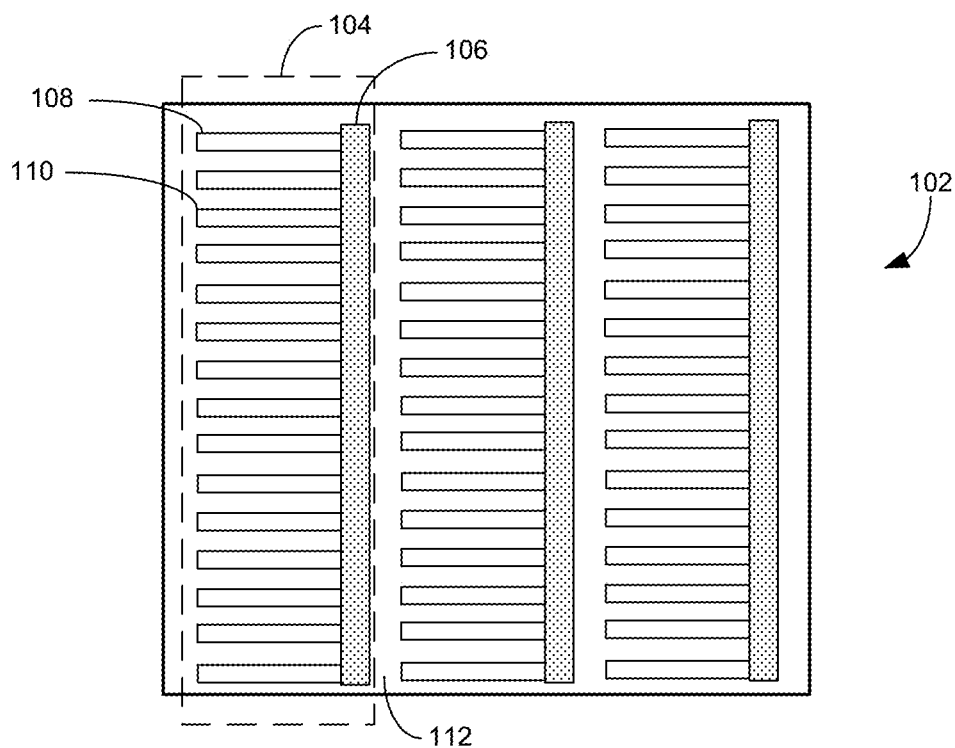
FIG. 1A shows an exemplary conductive grid pattern on the front surface of a photovoltaic structure.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Overview

Embodiments described herein provide a solution for the technical problem of providing moisture-resistant photovoltaic structures for solar roof tile application. In some embodiments, a moisture-resistant layer (e.g., a dielectric layer) can be deposited on the transparent-conductive oxide (TCO) layer, thus preventing moisture from reaching the solar cell junction via the TCO layer. Alternatively, specially designed TCO material can be used to form a moisture-resistant TCO layer, thus preventing moisture from penetrating the TCO layer.

Solar Roof Tile with Cascaded Strips

As described in U.S. patent application Ser. No. 14/563,867, parallel connecting multiple (such as 3) strings of cascaded solar strips can provide a solar module with a reduced internal resistance. In general, a cell can be divided into a number of (e.g., n) strips, and a module can contain a number of parallel strings of cascaded strips (the number of strings can be the same as or different from the number of strips in the cell). If a string has the same number of strips as the number of undivided photovoltaic structures in a conventional single-string module, the string can output approximately the same voltage as the conventional module. Multiple strings can be connected in parallel to form a module. If the number of strings in the module is the same as the number of strips in the cell, the module can output roughly the same current as the conventional module. On the other hand, the module's total internal resistance can be a fraction (e.g., 1/n) of the resistance of a string. Therefore, in general, the greater n is, the lower the total internal resistance of the module, and the more power one can extract from the module. However, a tradeoff is that as n increases, the number of connections required to interconnect the strings also increases, which increases the amount of contact resistance. Also, the greater n is, the more strips a single cell needs to be divided into, which increases the associated production cost and decreases overall reliability due to the larger number of strips used in a single panel.

Another consideration in determining n is the contact resistance between the electrode and the photovoltaic structure on which the electrode is formed. The greater this contact resistance, the greater n might need to be to reduce effectively the panel's overall internal resistance. Hence, for a particular type of electrode, different values of n might be needed to attain sufficient benefit in reduced total panel internal resistance to offset the increased production cost and reduced reliability. For example, a conventional electrode based on silver-paste or aluminum may require n to be greater than 4, because the process of screen printing and firing silver paste onto a cell does not produce an ideal resistance between the electrode and the underlying photovoltaic structure. In some embodiments, the electrodes, including both the busbars and finger lines, can be fabricated using a combination of physical vapor deposition (PVD) and electroplating of copper as an electrode material. The resulting copper electrode can exhibit lower resistance than an aluminum or screen-printed, silver-paste electrode. Consequently, a smaller n can be used to attain the benefit of reduced panel internal resistance. In some embodiments, n is selected to be three, which is less than the n value generally needed for cells with silver-paste electrodes or other types of electrodes. Correspondingly, two grooves can be scribed on a single cell to allow the cell to be divided into three strips.

In addition to lower contact resistance, electroplated copper electrodes can also offer better tolerance to microcracks, which may occur during a cleaving process. Such microcracks might adversely affect cells with silver-paste electrodes. Plated-copper electrodes, on the other hand, can preserve the conductivity across the cell surface even if there are microcracks in the photovoltaic structure. The copper electrode's higher tolerance for microcracks allows one to use thinner silicon wafers to manufacture cells. As a result, the grooves to be scribed on a cell can be shallower than the grooves scribed on a thicker wafer, which in turn helps increase the throughput of the scribing process. More details on using copper plating to form a low-resistance electrode on a photovoltaic structure are provided in U.S. patent application Ser. No. 13/220,532, entitled "SOLAR CELL WITH ELECTROPLATED GRID," filed Aug. 29, 2011, the disclosure of which is incorporated herein by reference in its entirety.

FIG. 1A shows an exemplary grid pattern on the front surface of a photovoltaic structure, according to one embodiment. In the example shown in FIG. 1A, grid 102 includes three sub-grids, such as sub-grid 104. This three sub-grid configuration allows the photovoltaic structure to be divided into three strips. To enable cascading, each sub-grid needs to have an edge busbar, which can be located either at or near the edge. In the example shown in FIG. 1A, each sub-grid includes an edge busbar ("edge" here refers to the edge of a respective strip) running along the longer edge of the corresponding strip and a plurality of parallel finger lines running in a direction parallel to the shorter edge of the strip. For example, sub-grid 104 can include edge busbar 106, and a plurality of finger lines, such as finger lines 108 and 110. To facilitate the subsequent laser-assisted scribe-and-cleave process, a predefined blank space (i.e., space not covered by electrodes) is inserted between the adjacent sub-grids. For example, blank space 112 is defined to separate sub-grid 104 from its adjacent sub-grid. In some embodiments, the width of the blank space, such as blank space 112, can be between 0.1 mm and 5 mm, preferably between 0.5 mm and 2 mm. There is a tradeoff between a wider space that leads to a more tolerant scribing operation and a narrower space that leads to more effective current collection. In a further embodiment, the width of such a blank space can be approximately 1 mm.

Figure 1B:
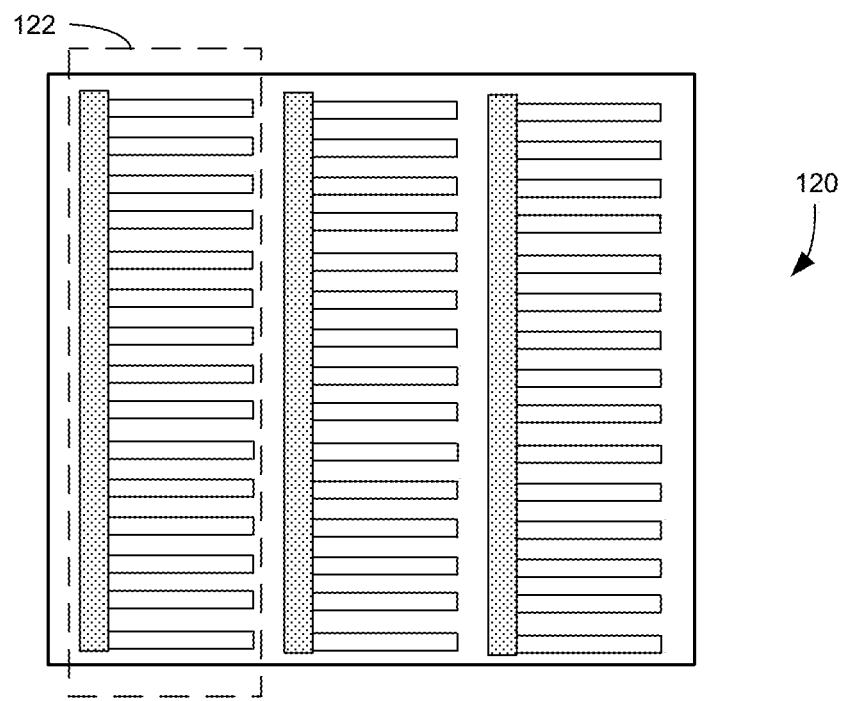
FIG. 1B shows an exemplary conductive grid pattern on the back surface of a photovoltaic structure.

FIG. 1B shows an exemplary grid pattern on the back surface of a photovoltaic structure, according to one embodiment. In the example shown in FIG. 1B, back grid 120 can include three sub-grids, such as sub-grid 122. To enable cascaded and bifacial operation, the back sub-grid may correspond to the front sub-grid. More specifically, the back edge busbar needs to be located near the opposite edge of the frontside edge busbar. In the examples shown in FIGS. 1A and 1B, the front and back sub-grids have similar patterns except that the front and back edge busbars are located adjacent to opposite edges of the strip. In addition, locations of the blank spaces in back conductive grid 120 correspond to locations of the blank spaces in front conductive grid 102, such that the grid lines do not interfere with the subsequent scribe-and-cleave process. In practice, the finger line patterns on the front and back side of the photovoltaic structure may be the same or different.

In the examples shown in FIGS. 1A and 1B, the finger line patterns can include continuous, non-broken loops. For example, as shown in FIG. 1A, finger lines 108 and 110 both include connected loops with rounded corners. This type of "looped" finger line pattern can reduce the likelihood of the finger lines peeling away from the photovoltaic structure after a long period of usage. Optionally, the sections where parallel lines are joined can be wider than the rest of the finger lines to provide more durability and prevent peeling. Patterns other than the one shown in FIGS. 1A and 1B, such as un-looped straight lines or loops with different shapes, are also possible.

Figure 2A:
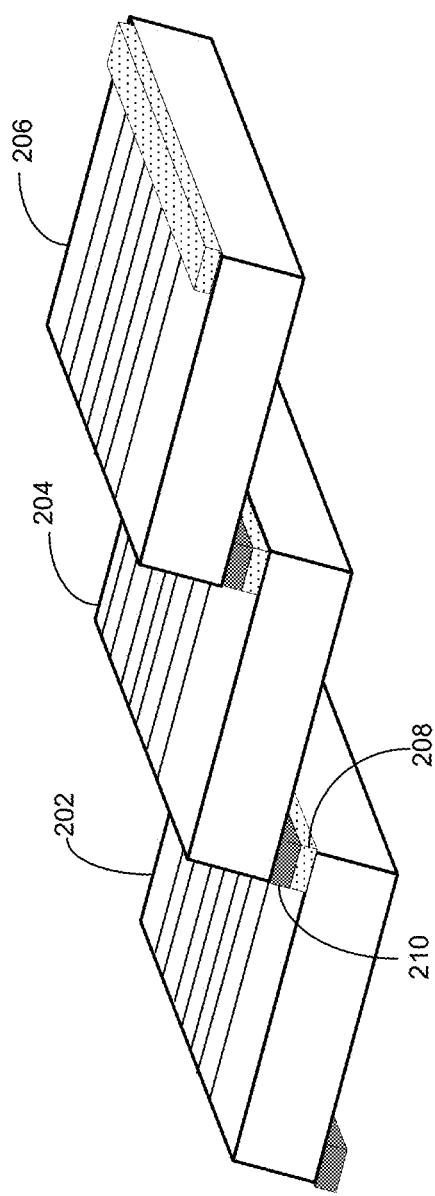
FIG. 2A shows a string of strips stacked in a cascaded pattern.

To form a cascaded string, cells or strips (e.g., as a result of a scribing-and-cleaving process applied to a regular square cell) can be cascaded with their edges overlapped. FIG. 2A shows a string of cascaded strips, according to one embodiment. In FIG. 2A, strips 202, 204, and 206 are stacked in such a way that strip 206 partially overlaps adjacent strip 204, which also partially overlaps (on an opposite edge) strip 202. Such a string of strips forms a pattern that is similar to roof shingles. Each strip includes top and bottom edge busbars located at opposite edges of the top and bottom surfaces, respectively. Strips 202 and 204 are coupled to each other via an edge busbar 208 located at the top surface of strip 202 and an edge busbar 210 located at the bottom surface of strip 204. To establish electrical coupling, strips 202 and 204 are placed in such a way that bottom edge busbar 210 is placed on top of and in direct contact with top edge busbar 208.

Figure 2B:
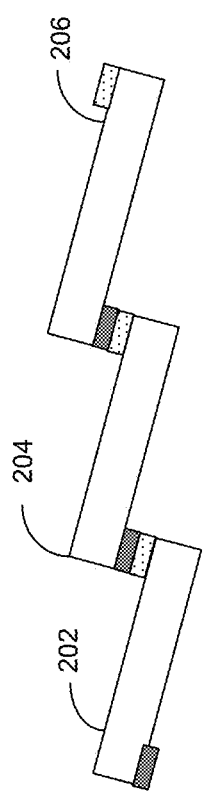
FIG. 2B shows the side view of the string of cascaded strips.

FIG. 2B shows a side view of the string of cascaded strips, according to one embodiment of the invention. In the example shown in FIGS. 2A and 2B, the strips can be part of a six-inch square or pseudo-square photovoltaic structure, with each strip having a dimension of approximately two inches by six inches. To reduce shading, the overlapping between adjacent strips should be kept as small as possible. In some embodiments, the single busbars (both at the top and the bottom surfaces) are placed at the very edge of the strip (as shown in FIGS. 2A and 2B). The same cascaded pattern can extend along an entire row of strips to form a serially connected string.

Figure 3A:
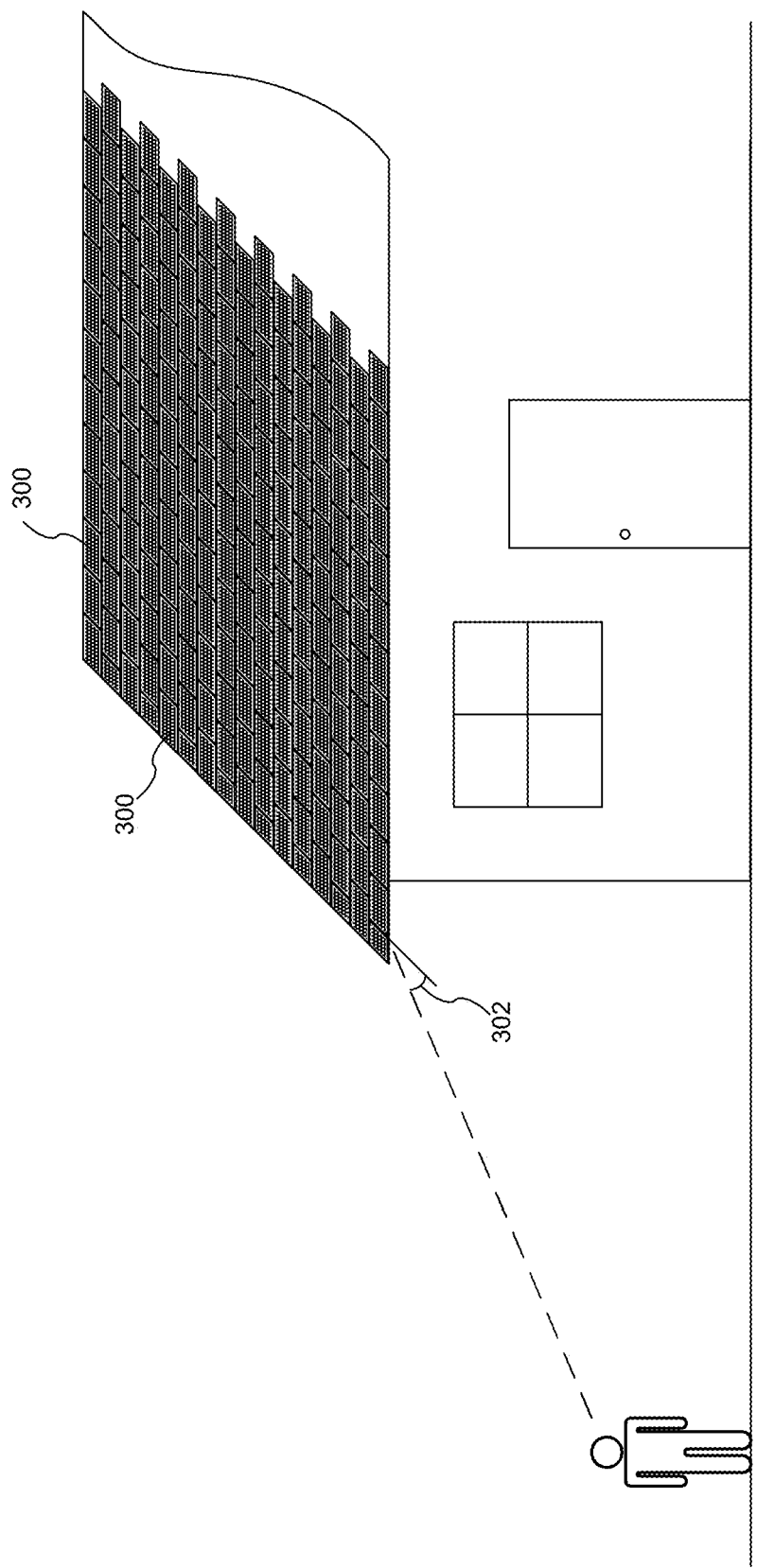
FIG. 3A shows an exemplary configuration of solar roof tiles on a house, according to one embodiment.

FIG. 3A shows an exemplary configuration of solar roof tiles on a house, according to one embodiment. In this example, solar roof tiles 300 can be installed on a house like conventional roof tiles or shingles, and can provide the functions of conventional roof tiles as well as solar cells. Particularly, a solar roof tile can be placed along with other tiles in such a way as to prevent water leakage. At the same time, electrical connections can be made between two adjacent tiles to interconnect multiple tiles into a module, so that a number of solar roof tiles can jointly provide electrical power.

Figure 3B:
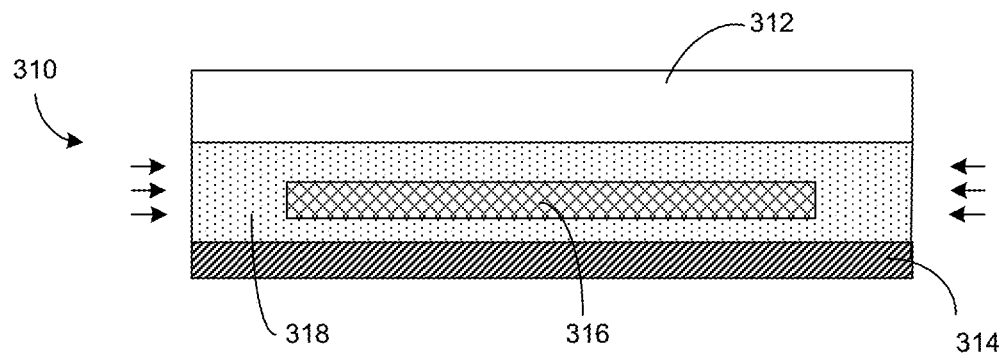
FIG. 3B shows the structure of an exemplary solar roof tile, according to one embodiment.

FIG. 3B shows the structure of an exemplary solar roof tile, according to one embodiment. Solar roof tile 310 can include front cover 312, back cover 314, one or more photovoltaic structures 316, and encapsulant 318 that encapsulates photovoltaic structures 316 between front cover 312 and back cover 314.

Front cover 312 can be made of tempered glass and back cover 314 can be made of a wide variety of materials, including but not limited to: glass, polyethylene terephthalate (PET), fluoropolymer, polyvinyl fluoride (PVF), polyamide, etc. For solar roof tile applications where color control is important, non-transparent backsheets (e.g., backsheets made of PET and PVF) are often used as the back cover. However, compared to glass covers, these backsheets are less moisture-resistant.

Figure 3C:
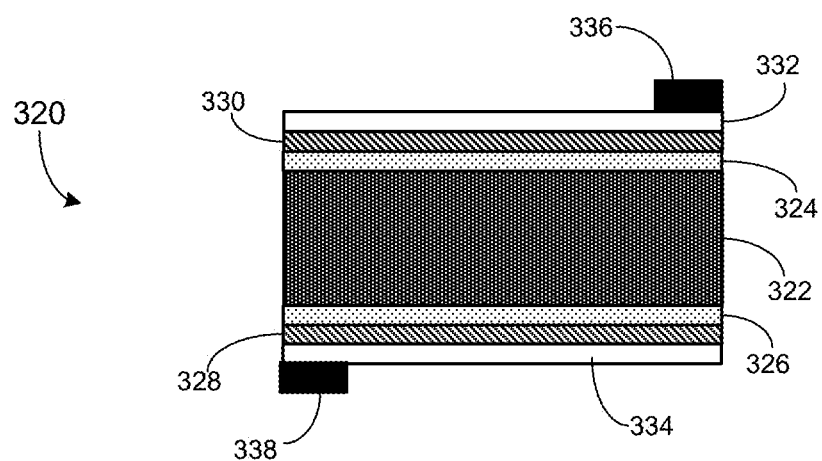
FIG. 3C shows the structure of an exemplary photovoltaic strip, according to one embodiment.

Photovoltaic structures 316 can include a number of electrically coupled, either in series or in parallel, photovoltaic strips. In some embodiments, photovoltaic structures 316 can include a plurality of cascaded strips, which are arranged in a way similar to the ones shown in FIGS. 2A-2B. FIG. 3C shows the structure of an exemplary photovoltaic strip, according to one embodiment. Photovoltaic strip 320 can include crystalline-Si (c-Si) base layer 322. To enhance efficiency, a quantum tunneling barrier (QTB) layer (e.g., layers 324 and 326) can be deposited on both surfaces of base layer 322. In some embodiments, thin QTB layer can include a thin layer of silicon oxide ($SiO_x$), which can be formed on c-Si base layer 322 using a wet oxidation process. More specifically, the QTB layer can include a layer of silicon monoxide (SiO) having a thickness between 1 and 10 nm.

Photovoltaic strip 320 can also include emitter layer 328, surface field layer 330, and transparent conductive oxide (TCO) layers 332 and 334. Emitter layer 328 can include doped amorphous-Si (a-Si), and surface field layer 330 can include doped c-Si. TCO layers 332 and 334 can be made of typical TCO materials, including but not limited to: indium tin oxide (ITO), tin-oxide ($SnO_x$), aluminum doped zinc-oxide (ZnO:Al or AZO), or gallium doped zinc-oxide (ZnO:Ga). To facilitating shingling, photovoltaic strip 320 can also include edge busbars 336 and 338 that are located on opposite surfaces and edges of photovoltaic strip 320. Details, including fabrication methods, about the photovoltaic strip can be found in U.S. Pat. No. 8,686,283, entitled "Solar Cell with Oxide Tunneling Junctions," filed Nov. 12, 2010, the disclosure of which is incorporated by reference in its entirety herein.

Returning to FIG. 3B, photovoltaic structures 316 are encapsulated between front cover 312 and back cover 314 by encapsulant 318. Encapsulant 318 typically can include EVA (ethyl vinyl acetate), which can be designed to be transparent (or mostly transparent) to the entire spectrum of visible light.

As shown in FIG. 3B, due to its unique size requirement, unlike a conventional solar panel, a solar roof tile is frameless. This means that encapsulant 318 can be directly exposed to the external environment and moisture can enter the solar roof tile from the edges, as shown by the arrows. In addition, moisture may also enter the roof tile though back cover 314, if back cover 314 is a backsheet. Once inside the solar roof tile, moisture can gradually penetrate encapsulant 318 to reach photovoltaic structures 316, because the widely used encapsulant material EVA has a relatively high moisture vapor transmission rate (MVTR).

Moisture within a solar roof tile can degrade solar cell performance in multiple ways. For example, metal electrodes may corrode when exposed to moisture for a prolonged period, thus reducing power output. Moreover, once moisture reaches the surfaces of the photovoltaic structure, it may change the TCO properties. For example, ZnO or ITO films may become rough or porous when exposed to moisture for a prolonged time. A rough TCO layer may scatter light, reducing the solar cell efficiency, and a porous TCO film can allow the moisture to reach the solar cell junction, thus significantly degrading the energy conversion efficiency. In addition, moisture absorption in the TCO layer can increase the TCO resistivity, which can also cause reduction in output power. Therefore, moisture protection plays a very important role in ensuring long-term reliability of solar roof tiles.

One simple approach for enhanced moisture protection is to use an encapsulant material that is more resistant to moisture. Polyolefin has a low MVTR and can be used as an encapsulant. In addition, studies have also shown that silicone can provide better moisture protection than EVA. However, both polyolefin and silicone are more rigid than EVA and often cannot provide adequate protection to photovoltaic structures against shocks and vibrations. To solve this problem, in some embodiments, a hybrid approach is used when choosing the encapsulant material.

Figure 4A:
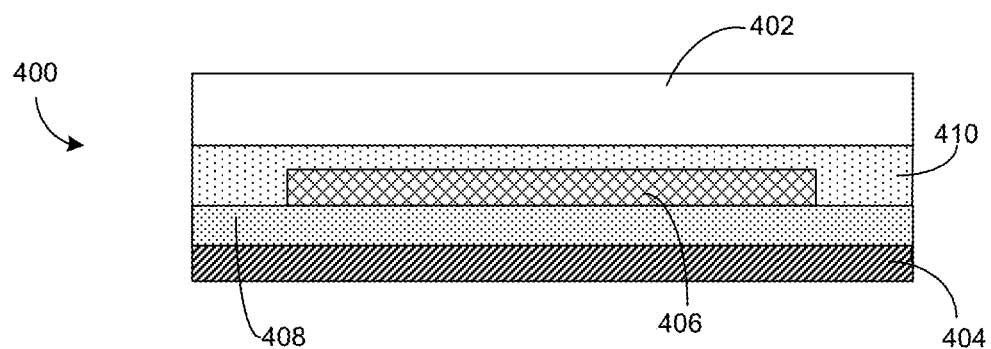
FIG. 4A shows the structure of an exemplary solar roof tile, according to one embodiment.

FIG. 4A shows the structure of an exemplary solar roof tile, according to one embodiment. Solar roof tile 400 can include front cover 402, backsheet 404, and one or more photovoltaic structures 406, which are similar to corresponding elements of solar roof tile 310 shown in FIG. 3B. However, unlike solar roof tile 310, which uses a uniform encapsulant to encapsulate the photovoltaic structures between the front cover and the backsheet, solar roof tile 400 can include two different types of encapsulant. More specifically, encapsulant layers 408 and 410 can be made of different materials. Encapsulant layer 408 is situated between photovoltaic structures 406 and backsheet 404 and can include a material having a low MVTR, such as polyolefin. Alternatively, encapsulant layer 408 can include silicone. Both polyolefin and silicone can effectively prevent moisture ingress from backsheet 404. On the other hand, the moisture-resistant requirement for encapsulant layer 410 can be more relaxed, because encapsulant layer 410 is positioned between front glass cover 402 and photovoltaic structures 406 and glass itself can be resistant to moisture ingress. Therefore, encapsulant layer 410 can include EVA, which can be a better shock absorber than polyolefin or silicone.

Figure 4B:
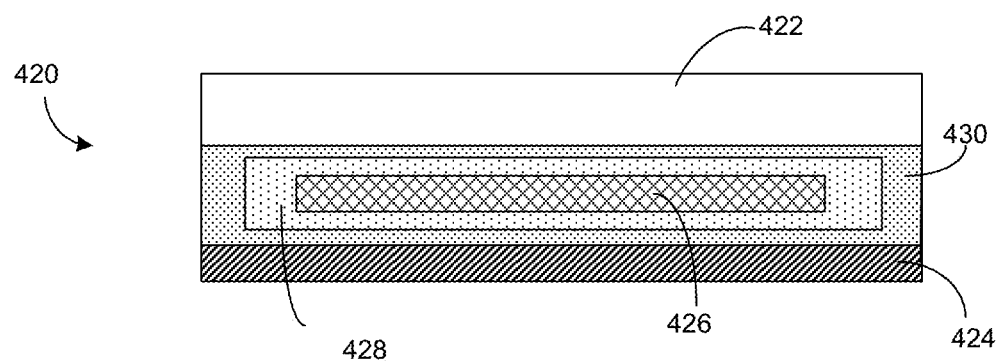
FIG. 4B shows the structure of an exemplary solar roof tile, according to one embodiment.

The hybrid encapsulant approach can also have other forms. For example, FIG. 4B shows the structure of an exemplary solar roof tile, according to one embodiment. In FIG. 4B, photovoltaic structures 426 is surrounded by encapsulant layer 428, which can include EVA. In addition, another layer of encapsulant, encapsulant layer 430 wraps around encapsulant layer 428. Encapsulant layer 430 can be made of moisture-resistant material, such as polyolefin and silicone and can effectively prevent moisture ingress from edges and the backsheet of solar roof tile 420. Both encapsulant layers 428 and 430 can facilitate encapsulation of photovoltaic structures between front cover 422 and backsheet 424.

Another approach for moisture protection of a solar roof tile is to make photovoltaic structures themselves more resistant to moisture. As discussed previously, conventional TCO layers are often permeable to moisture and can sometimes act as a medium for the moisture to reach the solar cell junction. To prevent degradation of the photovoltaic structures in the presence of moisture, one may need to prevent moisture ingress through the TCO layers.

In some embodiments, to prevent moisture ingress through the TCO layers, a moisture-protection coating can be applied onto each TCO layer to serve as a moisture barrier. The moisture-protection coating can be made of dielectric material, such as silicon oxide ($SiO_x$) or silicon nitride ($SiN_x$). Note that, to ensure greater moisture resistance, it is preferred that the $SiO_x$ or $SiN_x$ films are deposited onto the TCO layers using a plasma-enhanced chemical vapor deposition (PECVD) technique.

Figure 5A:
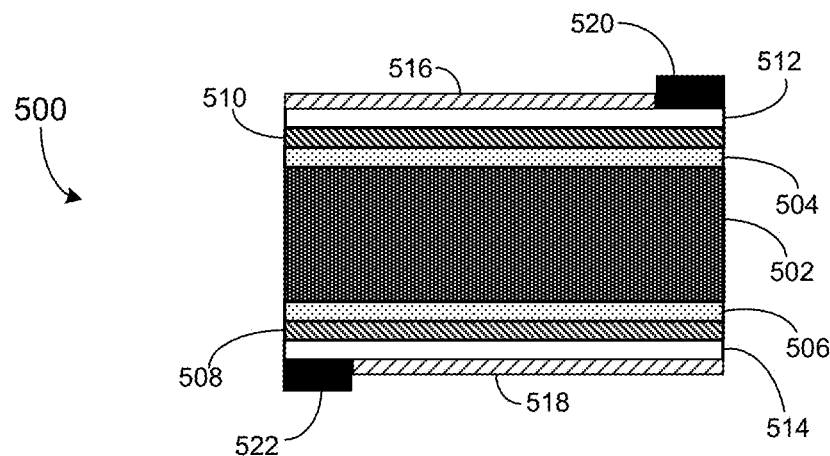
FIG. 5A shows the structure of an exemplary moisture-resistant photovoltaic structure, according to one embodiment.

FIG. 5A shows the structure of an exemplary moisture-resistant photovoltaic structure, according to one embodiment. Photovoltaic structure 500 can include base layer 502, QTB layers 504 and 506, emitter layer 508, surface field layer 510, TCO layers 512 and 514, moisture-protection coatings 516 and 518, and edge busbars 520 and 522.

Base layer 502 and QTB layers 504 and 506 can be similar to base layer 322 and QTB layers 324 and 326, respectively, shown in FIG. 3C. Emitter layer 508 and surface field layer 510 can be similar to emitter layer 328 and surface field layer 330, respectively, shown in FIG. 3C. TCO layers 512 and 514 can be similar to TCO layers 332 and 334, respectively, shown in FIG. 3C. More specifically, TCO layers 512 and 514 can be made of conventional TCO materials, such as ZnO and ITO, and can be sensitive to moisture.

Moisture-protection coatings 516 and 518 can substantially cover the surface of TCO layers 512 and 514, respectively. More particularly, other than the portions that are in contact with the metal electrode (e.g., the finger lines and the edge busbars), the entire surface of each TCO layer is covered by a moisture-protection coating, thus preventing moisture from reaching the TCO layer. Moisture-protection coatings 516 and 518 can each include one or more dielectric thin films, such as $SiO_x$ or $SiN_x$ thin films. For good moisture-protection effect, the thickness of moisture-protection coatings 516 and 518 should be sufficiently thick. In some embodiments, moisture-protection coatings 516 and 518 can have a thickness that is between 50 and 500 nm. In further embodiments, a $Si_3N_4$ film having a thickness of 100 nm can be deposited onto TCO layers 512 and 514 to form moisture-protection coatings 516 and 518. Various deposition techniques, including chemical vapor deposition (CVD) and physical vapor deposition (PVD), can be used to form moisture-protection coatings 516 and 518. To ensure a strong moisture barrier, moisture-protection coatings 516 and 518 can be deposited onto TCO layers 512 and 514 using a PECVD technique.

In the example shown in FIG. 5A, photovoltaic structure 500 includes TCO layers as part of the electrical contacts. In practice, it is also possible that the photovoltaic structures encapsulated inside a solar roof tile do not have TCO layers. Instead, electrical contacts can be established directly between a metal electrode and the emitter or surface field layer. In such scenarios, a moisture-protecting coating can be deposited onto the emitter or surface field layer. The moisture-protecting coating used here also needs to be patterned to allow electrical coupling between the metal electrode and the emitter or surface field layer.

In addition to applying a moisture-protection coating on the TCO layer to serve as a moisture barrier, in some embodiments, it is also possible to fabricate a moisture-resistant photovoltaic structure by replacing the conventional TCO layers with moisture-resistant TCO layers. The moisture-resistant TCO layers can serve as moisture barriers to prevent moisture from reaching the junction between the base layer and the emitter. As discussed previously, TCO layers fabricated using conventional techniques or materials can be sensitive to moisture and can be permeable to moisture. Therefore, a novel fabrication technique or material is needed to obtain moisture-resistant TCO layers.

It has been shown that, in terms of moisture resistance, ITO significantly outperforms ZnO, such as Al:ZnO (also known as AZO). However, ITO fabricated under conventional conditions cannot meet the moisture-resistant requirement of solar roof tiles. This is because, under conventional conditions, the grain size of a fabricated ITO layer can be relatively small, thus resulting in a higher permeability to moisture. To solve this problem, in some embodiments, an ITO layer with a larger grain size (e.g., the smallest dimension of the grains is larger than 40 nm) can be fabricated. More specifically, the ITO layer can undergo a high temperature (e.g., greater than 400° C.) annealing process to obtain larger grain sizes. Note that, conventional ITO fabrication processes often involve an annealing temperature at about 250° C., which can result in an ITO layer with smaller grain sizes.

In addition to increasing the anneal temperature of the ITO, it is also possible to use Si doped ZnO to obtain a moisture-resistant TCO layer. Alternative dopants, such as Ga and In ions, can also be used to dope ZnO to obtain IGZO films. Studies have shown that by tuning the dopant concentration, more particularly the Ga concentration, one can improve the moisture resistance of the IGZO film. In some embodiments, the concentration of $In_2O_3$ is increased to at least 10 wt % to obtain a moisture-resistant IGZO film. Additional types of moisture-resistant TCO material can include indium oxide ($In_2O_3$) doped with Ti, Ta, or both. More specifically, the moisture-resistant TCO material can include $TiO_2$ doped $In_2O_3$, with the doping concentration (by weight) of $TiO_2$ in the range between 0.2% and 2%, preferably between 0.5% and 1%. Alternatively, the moisture-resistant TCO material can include $In_2O_3$ doped with both $TiO_2$ and $Ta_2O_5$, with the doping concentration (by weight) of $TiO_2$ in the range between 0.2% and 2%, preferably between 0.5% and 1%, and the doping concentration (by weight) of $Ta_2O_5$ in the range between 0 and 1%, preferably between 0.2% and 0.6%. Other types of TCO material are also possible for enhancing moisture resistance, including but not limited to: ITO with low (e.g., less than 2% by weight) $SnO_2$ doping, tungsten doped $In_2O_3$ (IWO), and cerium doped indium oxide (ICeO).

Figure 5B:
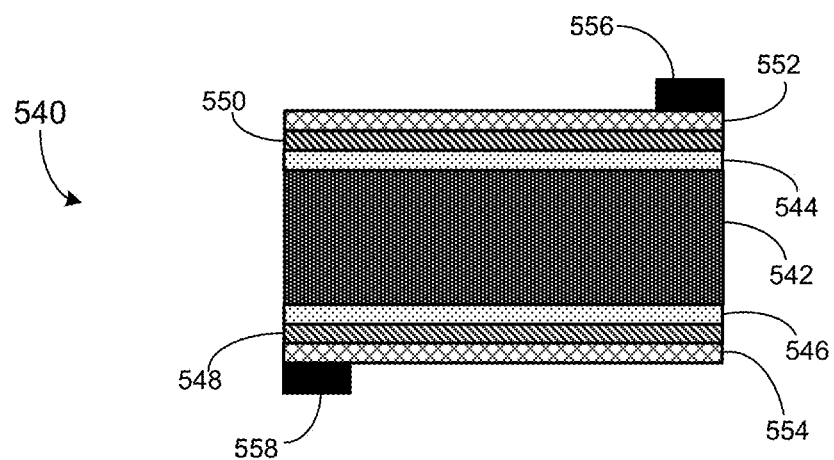
FIG. 5B shows the structure of an exemplary moisture-resistant photovoltaic structure, according to one embodiment.

FIG. 5B shows the structure of an exemplary moisture-resistant photovoltaic structure, according to one embodiment. Photovoltaic structure 540 can include base layer 542, QTB layers 544 and 546, emitter layer 548, surface field layer 550, moisture-resistant TCO layers 552 and 554, and edge busbars 556 and 558.

Base layer 542 and QTB layers 544 and 546 can be similar to base layer 322 and QTB layers 324 and 326, respectively, shown in FIG. 3C. Emitter layer 548 and surface field layer 550 can be similar to emitter layer 328 and surface field layer 330, respectively, shown in FIG. 3C.

Moisture-resistant TCO layers 552 and 554 can include ITO with a grain size larger than 40 nm, Si doped ZnO, or IGZO with the concentration of $In_2O_3$ being greater than 10 wt %. More specifically, the larger grain ITO layers can be fabricated using a low temperature (e.g., less than 200° C.) PVD process followed by a high temperature (e.g., greater than 400° C.) thermal annealing process. When moisture-resistant TCO layers are applied, there is no longer a need for the dielectric moisture-protection coating, thus significantly simplifying the fabrication process. Edge busbars 556 and 558 can be formed on top of moisture-resistant TCO layers 552 and 554, respectively.

Figure 6:
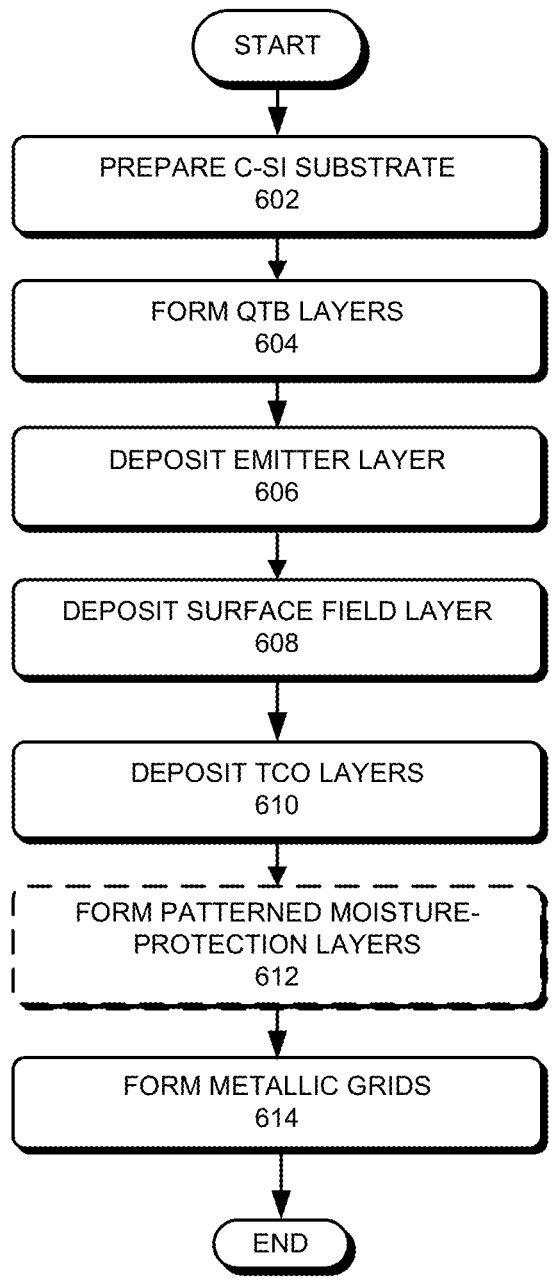
FIG. 6 shows an exemplary fabrication process of a moisture-resistant photovoltaic structure, according to one embodiment.

FIG. 6 shows an exemplary fabrication process of a moisture-resistant photovoltaic structure, according to one embodiment. During fabrication, a crystalline-Si (c-Si) substrate can be prepared (operation 602). In some embodiments, a standard texturing and cleaning process can be applied to both surfaces of a crystalline-Si wafer. Front and back QTB layers can then be formed (e.g., using a wet oxidation process) on both surfaces of the c-Si base layer (operation 604). Subsequently, a layer of hydrogenated amorphous Si (a-Si) can be deposited on a QTB layer (e.g., the back QTB layer that faces away from sunlight) to form an emitter (operation 606). The emitter typically has a doping type that is opposite to that of the base layer. In some embodiments, the emitter layer can have a graded doping profile. Similarly, a different layer of hydrogenated amorphous Si (a-Si) can be deposited on the other QTB layer (e.g., the front QTB layer) to form a surface field layer (operation 608). The surface field layer typically has a doping type that is the same as that of the base layer.

After the formation of the emitter and surface field layers, front and back TCO layers can be deposited on the emitter and surface field layers (operation 610). In some embodiments, the front and back TCO layers may be formed simultaneously. Alternatively, the front and back TCO layers may be formed sequentially. A PVD process, such as evaporation or sputtering, can be used to deposit the TCO layers.

In some embodiments, the TCO layers can be formed in such a way that they have superior moisture-resistant properties. For example, forming the TCO layers can include depositing, using a low-temperature PVD process, an ITO layer on the emitter or surface field layer, followed by a high temperature thermal annealing process, which can include annealing the ITO at a temperature greater than 400° C. Alternatively, forming the TCO layers can include depositing a Si doped ZnO layer or a Ga and In co-doped ZnO layer on the emitter or surface field layer.

Subsequently, a patterned moisture-protection coating can be formed on each TCO layer (operation 612). More specifically, the moisture-protection coating is patterned according to the pattern of the metal grid (e.g., locations of finger lines and busbars). Because the moisture-protection coating is dielectric, to enable electrical coupling between the metal electrode and the TCO layers, the moisture-protection coating needs to be patterned. Various techniques can be used to form the patterned moisture-protection coatings. In some embodiments, a combination of a photolithography process and a PECVD process can be used to form a patterned moisture-protection layer (e.g., a patterned $Si_3N_4$ layer). Operation 612 can be optional if the TCO layers have superior moisture-resistant properties.

Front and back metallic grids, including finger lines and busbars can then be formed on the patterned front and back moisture-protection coatings, respectively, to complete the fabrication of the photovoltaic structure (operation 614). More specifically, metallic material (e.g., Cu ions) can be deposited into the windows of the patterned moisture-protection coating to form a metallic grid. In some embodiments, the metallic grid can include a PVD seed layer and an electroplated bulk layer.

Figure 7:
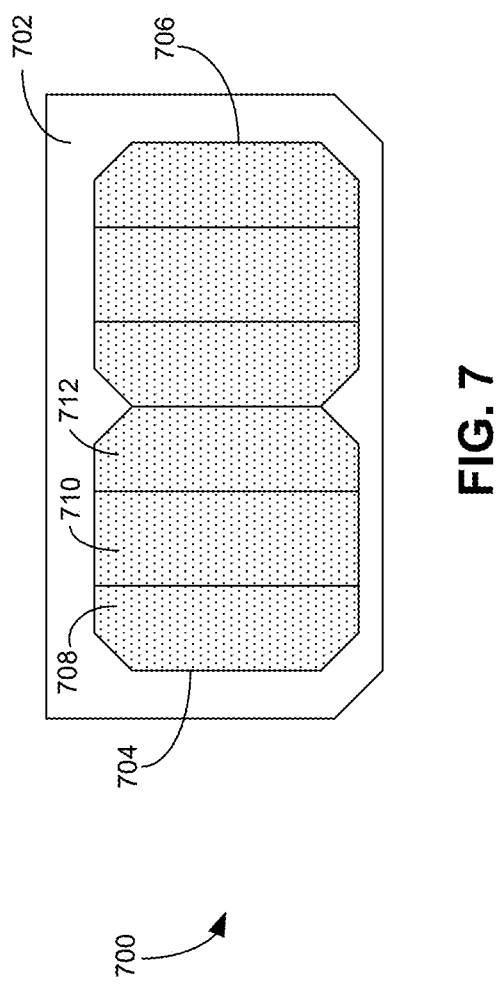
FIG. 7 shows the top view of an exemplary solar roof tile, according to one embodiment.

FIG. 7 shows the top view of an exemplary solar roof tile, according to one embodiment. In FIG. 7, solar roof tile 700 can include front glass cover 702 and solar cells 704 and 706. Each solar cell can be a conventional square or pseudo-square solar cell, such as a six-inch solar cell. In some embodiments, solar cells 704 and 706 can each be divided into three separate pieces of similar or different sizes. For example, solar cell 704 can include strips 708, 712, and 712. These strips can be arranged in such a way that adjacent strips partially overlap at the edges, similar to the ones shown in FIGS. 2A-2B. For simplicity of illustration, the electrode grids, including the finger lines and edge busbars, of the strips are not shown in FIG. 7.

Figure 8:
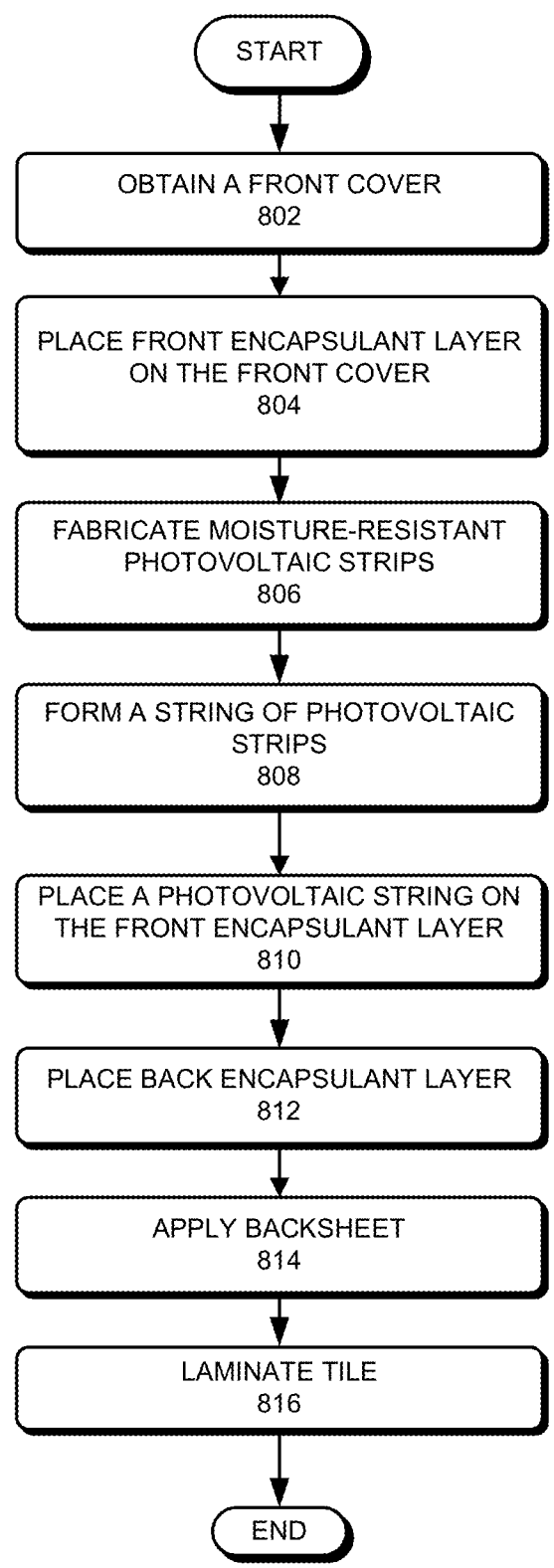
FIG. 8 shows a flowchart illustrating an exemplary fabrication process of a solar roof tile, according to one embodiment.

To further improve moisture-protection, in some embodiments, the hybrid encapsulant approach can be combined with the moisture-resistant photovoltaic structures. FIG. 8 shows a flowchart illustrating an exemplary fabrication process of a solar roof tile, according to one embodiment. During fabrication, a front cover of an appropriate size can be obtained (operation 802). Depending on the design, in some embodiments, the front cover can be large enough to accommodate at least two 6-inch square solar cells placed side by side. In some embodiments, the front cover can be made of tempered glass.

A front encapsulant layer can be placed on the front cover (operation 804). In some embodiments, the front encapsulant layer may include a layer of EVA. In alternative embodiments, the front encapsulant layer may include multiple layers of encapsulant material. The encapsulant layer that is in direct contact with the photovoltaic structures can include EVA, whereas the encapsulant layer that is in direct contact with the front cover can include moisture-resistant silicone or polyolefin.

Subsequently, moisture-resistant photovoltaic strips can be obtained (operation 806). In some embodiments, the moisture-resistant photovoltaic strips can include dielectric moisture-protection layers deposited onto conventional TCO layers. In some embodiments, the moisture-resistant photovoltaic strips can include moisture-resistant TCO layers. In some embodiments, the moisture-resistant photovoltaic strips can include dielectric moisture-protection layers deposited onto the moisture-resistant TCO layers. A number of photovoltaic strips can be electrically and mechanically coupled to form a string (operation 808), and a string of photovoltaic strips can be placed on the front encapsulant layer (operation 810). In some embodiments, a solar roof tile may include one string that comprises six cascaded strips. More specifically, photovoltaic strips can be obtained by dividing a standard square or pseudo-square solar cell into multiple pieces; and a string of strips can be formed by cascading multiple strips at the edges. The cascading forms a serial connection among the strips. Detailed descriptions about the formation of a cascaded string of photovoltaic strips can be found in U.S. patent application Ser. No. 14/826,129, entitled "PHOTOVOLTAIC STRUCTURE CLEAVING SYSTEM," filed Aug. 13, 2015; U.S. patent application Ser. No. 14/866,776, entitled "SYSTEMS AND METHODS FOR CASCADING PHOTOVOLTAIC STRUCTURES," filed Sep. 25, 2015; U.S. patent application Ser. No. 14/804,306, entitled "SYSTEMS AND METHODS FOR SCRIBING PHOTOVOLTAIC STRUCTURES," filed Jul. 20, 2015; U.S. patent application Ser. No. 14/866,806, entitled "METHODS AND SYSTEMS FOR PRECISION APPLICATION OF CONDUCTIVE ADHESIVE PASTE ON PHOTOVOLTAIC STRUCTURES," filed Sep. 25, 2015; and U.S. patent application Ser. No. 14/866,817, entitled "SYSTEMS AND METHODS FOR TARGETED ANNEALING OF PHOTOVOLTAIC STRUCTURES," filed Sep. 25, 2015; the disclosures of which are incorporated herein by reference in their entirety.

Subsequently, a back encapsulant layer can be placed on the photovoltaic string (operation 812). Similar to the front encapsulant layer, the back encapsulant layer can include a single EVA layer or multiple layers of encapsulant material. The encapsulant layer that is in direct contact with the photovoltaic structures can include EVA, whereas the encapsulant layer that is in direct contact with the backsheet can include moisture-resistant silicone or polyolefin. A backsheet can then be placed on the back encapsulant layer (operation 814), followed by a lamination process to form a solar roof tile (operation 816).

The foregoing descriptions of various embodiments have been presented only for purposes of illustration and description. They are not intended to be exhaustive or to limit the invention to the forms disclosed. Accordingly, many modifications and variations will be apparent to practitioners skilled in the art. Additionally, the above disclosure is not intended to limit the invention.

What is claimed is:
1. A solar roof tile, comprising:
   a front cover;
   a back cover; and
   one or more photovoltaic structures positioned between the front cover and the back cover, wherein a respective photovoltaic structure comprises:
      a base layer;
      an emitter layer positioned on a first side of the base layer;
      a transparent conductive oxide (TCO) layer positioned on the emitter layer; and
      a moisture barrier layer directly deposited onto the TCO layer, configured to reduce an amount of moisture that reaches a junction between the base layer and the emitter layer, wherein the moisture barrier layer comprises a patterned dielectric layer in direct contact with the TCO layer and having openings that allow a metallic edge busbar to be in contact with the TCO layer; and
   a bilayer encapsulant structure positioned between the front cover and the back cover, wherein the bilayer encapsulant structure comprises a first encapsulant layer and a second encapsulant layer, wherein the first encapsulant layer comprises a first material and the second encapsulant layer comprises a second material, and wherein the first material has a higher moisture transmission rate than the second material and the second material is more rigid than the first material.

2. The solar roof tile of claim 1, wherein the TCO layer comprises one or more of:
   an indium tin oxide (ITO) layer with a grain size of at least 40 nm;
   Ti doped indium oxide;
   Ti and Ta doped indium oxide;
   tungsten doped indium oxide;
   cerium doped indium oxide;
   a layer of Si doped ZnO; and
   a layer of Ga and In co-doped ZnO (IGZO).

3. The solar roof tile of claim 1, wherein the dielectric coating comprises silicon oxide (SiOx) or silicon nitride (SiNx).

4. The solar roof tile of claim 1, wherein the front cover comprises tempered glass, wherein the back cover comprises a photovoltaic backsheet, and wherein the first encapsulant layer is positioned between the photovoltaic structures and the front cover and the second encapsulant layer is positioned between the photovoltaic structures and the back cover.

5. The solar roof tile of claim 4, wherein the first encapsulant layer comprises ethyl vinyl acetate (EVA), and wherein the second encapsulant layer comprises silicone or polyolefin.

6. The solar roof tile of claim 1, wherein the front cover comprises tempered glass, wherein the back cover comprises a photovoltaic backsheet, wherein the first encapsulant layer wraps around the photovoltaic structures, and wherein the second encapsulant layer wraps around the first encapsulant layer and the photovoltaic structures so that the first encapsulant layer and the second encapsulant layer are present between the front cover and the photovoltaic structures and so that the first encapsulant layer and the second encapsulant layer are present between the back cover and the photovoltaic structures.

7. A solar roof tile, comprising:
   a front cover;
   a back cover;
   one or more photovoltaic structures positioned between the front cover and the back cover; and
   a bilayer encapsulant structure positioned between the front cover and the back cover,
   wherein the bilayer encapsulant structure comprises a first encapsulant layer and a second encapsulant layer,
   wherein the first encapsulant layer comprises a first material and the second encapsulant layer comprises a second material,
   wherein the first material has a higher moisture transmission rate than the second material and the second material is more rigid than the first material,
   wherein the first encapsulant layer wraps around the photovoltaic structures, and
   wherein the second encapsulant layer wraps around the first encapsulant layer and the photovoltaic structures so that the first encapsulant layer and the second encapsulant layer are present between the front cover and the photovoltaic structures and so that the first encapsulant layer and the second encapsulant layer are present between the back cover and the photovoltaic structures.

\* \* \* \* \*